(12) United States Patent
An et al.

(10) Patent No.: US 8,294,107 B2
(45) Date of Patent: Oct. 23, 2012

(54) LOW-LUMINANCE IMAGING DEVICE USING SILICON PHOTOMULTIPLIER

(75) Inventors: Sung yong An, Gyunggi-do (KR); Ki Yeol Park, Gyunggi-do (KR); Dong Sik Yoo, Seoul (KR)

(73) Assignee: Samsung Electro-Mechanics Co., Ltd, Suwon, Gyunggi-Do (KR)

( * ) Notice: Subject to any disclaimer, the term of this patent is extended or adjusted under 35 U.S.C. 154(b) by 379 days.

(21) Appl. No.: 12/753,743

(22) Filed: Apr. 2, 2010

(65) Prior Publication Data

US 2011/0139961 A1    Jun. 16, 2011

(30) Foreign Application Priority Data

Dec. 15, 2009   (KR) .................. 10-2009-0124903

(51) Int. Cl.
*G01T 1/00*   (2006.01)
(52) U.S. Cl. ............ 250/361 R; 313/532; 313/533; 250/370.01
(58) Field of Classification Search ........... 250/361 R, 250/362, 370.01, 483.1; 313/532, 533, 387
See application file for complete search history.

(56) References Cited

U.S. PATENT DOCUMENTS

| 3,928,866 | A | * | 12/1975 | Digoy | 257/430 |
| 4,104,516 | A | * | 8/1978 | Wang et al. | 250/214 VT |
| 4,221,967 | A | * | 9/1980 | Wang et al. | 250/363.02 |
| 5,130,527 | A | * | 7/1992 | Gramer et al. | 250/214 VT |
| 6,667,472 | B2 | * | 12/2003 | Janeczko et al. | 250/214 VT |
| 2006/0289774 | A1 | * | 12/2006 | Endo et al. | 250/370.09 |
| 2008/0251692 | A1 | * | 10/2008 | Teshima et al. | 250/207 |
| 2009/0140157 | A1 | * | 6/2009 | Meng | 250/370.11 |
| 2010/0096555 | A1 | * | 4/2010 | Nelson | 250/363.04 |

FOREIGN PATENT DOCUMENTS

| JP | 05-054840 | 3/1993 |
| KR | 10-2007-0051782 A | 5/2007 |

* cited by examiner

*Primary Examiner* — David Porta
*Assistant Examiner* — Yara Green
(74) *Attorney, Agent, or Firm* — Blakely Sokoloff Taylor & Zafman LLP

(57) ABSTRACT

Disclosed is a low-luminance imaging device using a silicon photomultiplier, which includes a first optical portion for collecting incident light, the silicon photomultiplier including a plurality of microcells so that photons of collected light are converted into photoelectrons which are then multiplied, a phosphor screen for converting the multiplied photoelectrons into photons, a second optical portion for transferring the converted photons, and an image sensor for picking-up the transferred photons thus obtaining an image, so that the imaging device has a high photomultiplication factor thereby obtaining an image having good image quality even at low luminance and achieving a low bias voltage and a small size.

11 Claims, 3 Drawing Sheets

LOW-LUMINANCE IMAGING DEVICE USING SILICON PHOTOMULTIPLIER

CROSS REFERENCE TO RELATED APPLICATION

This application claims the benefit of Korean Patent Application No. 10-2009-0124903, filed Dec. 15, 2009, entitled "Imaging device for low-luminance using silicon photomultiplier devices", which is hereby incorporated by reference in its entirety into this application.

BACKGROUND OF THE INVENTION

1. Technical Field

The present invention relates to a low-luminance imaging device using a silicon photomultiplier.

2. Description of the Related Art

Conventional night imaging devices, which are mainly exemplified by a security camera, are of the infrared (IR) light emitting diode type that observes reflected IR scanning rays using a low-luminance pickup device including an IR lens coating or an iris lens, and are frequently employed in short-distance observation because of the limitations of observation distance or image quality.

However, the conventional imaging device using the light emitting diode is disadvantageous in terms of observation at low luminance, thus making it difficult to identify a distant subject, and is also problematic in that its size is difficult to reduce and power consumption is high because of the output of the IR light emitting diode.

In addition to the conventional night imaging device, a pickup device including a photomultiplier tube (PMT) for multiplying the number of photons and a lens combined thereto is being used as a low-luminance imaging device.

In the configuration of such a conventional low-luminance imaging device, the PMT is typically exemplified by a microchannel plate (MCP)-PMT similar in shape and principle to a vacuum tube type PMT.

The MCP-PMT, having a honeycombed shape, allows electrons to collide with the inner walls while passing through millions of optical fiber bundles thus emitting secondary electrons. Generally, the final multiplication factor of the electrons passed through the inner walls amounts to about $10^4$ times.

However, the conventional MCP-PMT is disadvantageous because it has a large volume, requires a high voltage of at least 1 kV, and is comparatively expensive.

Furthermore, because the MCP-PMT is affected by a magnetic field, it cannot be applied to equipment using a large magnetic field such as a magnetic resonance imaging device.

SUMMARY OF THE INVENTION

Accordingly, the present invention has been made keeping in mind the problems encountered in the related art and the present invention is intended to provide a low-luminance imaging device using a silicon photomultiplier, which enables a clear image to be obtained at low luminance and has a low bias voltage and a small size.

An aspect of the present invention provides an imaging device using a silicon photomultiplier, including a first optical portion for collecting incident light, the silicon photomultiplier composed of a plurality of microcells so that photons of collected light are converted into photoelectrons which are then multiplied, a phosphor screen for converting the multiplied photoelectrons into photons, a second optical portion for transferring the converted photons, and an image sensor for picking-up the transferred photons thus obtaining an image.

In this aspect, the first optical portion may be an object lens.

In this aspect, the silicon photomultiplier may include a first type silicon substrate, a first type epitaxial layer formed on the first type substrate, a high-concentration first type conductive layer formed on the first type epitaxial layer, a high-concentration second type conductive layer doped with a second type opposite the first type and formed on the high-concentration first type conductive layer, a polysilicon resistor formed on the high-concentration second type conductive layer so as to distribute voltage to the high-concentration second type conductive layer, an antireflection coating layer formed on the high-concentration second type conductive layer and the polysilicon resistor, a voltage distribution bus connected to the polysilicon resistor and the high-concentration second type conductive layer so as to distribute voltage to the high-concentration second type conductive layer, and a trench for optically isolating the microcells from each other and transferring the multiplied photoelectrons to the phosphor screen from the high-concentration second type conductive layer.

In this aspect, the first type silicon substrate may have a doping agent concentration of $10^{17}$~$10^{20}$ cm$^{-3}$.

In this aspect, the first type epitaxial layer may have a doping agent concentration of $10^{14}$~$10^{18}$ cm$^{-3}$ and a thickness of 3~10 μm.

In this aspect, the high-concentration first type conductive layer may have a doping agent concentration of $10^{15}$~$10^{18}$ cm$^{-3}$, and the high-concentration second type conductive layer may have a doping agent concentration of $10^{18}$~$10^{20}$ cm$^{-3}$.

In this aspect, the trench may include an insulating portion formed on an inner wall of the trench and a first metal portion integrated with the voltage distribution bus by filling a center of the trench defined by the insulating portion with a metal.

In addition, the trench may include an oxide film formed on an inner wall of the trench and a hollow-shaped second metal portion integrated with the voltage distribution bus by plating an inner surface of the oxide film with a metal.

In this aspect, the second optical portion may be an eye lens or an optical fiber portion.

In this aspect, the image sensor may be a charge coupled device or a complementary metal oxide semiconductor.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Figure 1:
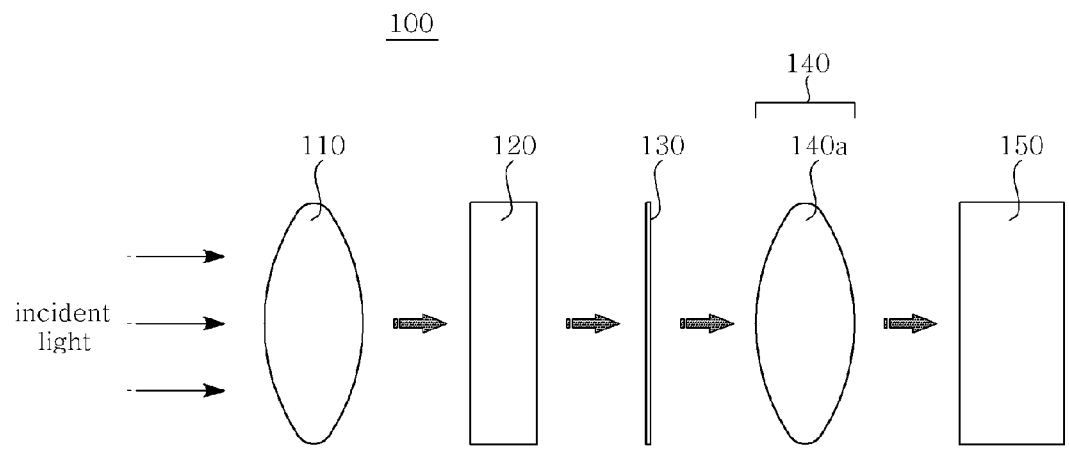
FIGS. 1 and 2 are views showing a low-luminance imaging device using a silicon photomultiplier according to embodiments of the present invention.

Hereinafter, embodiments of the present invention will be described in detail while referring to the accompanying drawings. Throughout the drawings, the same reference numerals are used to refer to the same or similar elements. Moreover, descriptions of known techniques, even if they are pertinent to the present invention, are regarded as unnecessary and may be omitted in so far as they would make the characteristics of the invention and the description unclear.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

Figure 2:
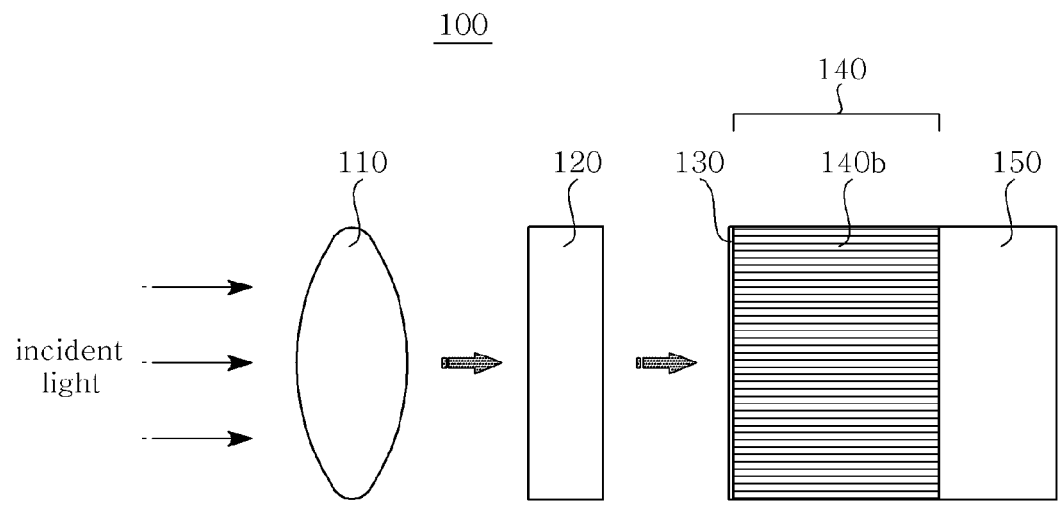

FIGS. 1 and 2 show a low-luminance imaging device using a silicon photomultiplier according to embodiments of the present invention.

With reference to FIGS. 1 and 2, the low-luminance imaging device 100, 200 according to the present embodiment includes a first optical portion 110, a silicon photomultiplier (SiPM) 120, a phosphor screen 130, a second optical portion 140, and an image sensor 150.

The first optical portion 110 is disposed ahead a light-receiving region of the SiPM 120 to collect light so that a greater amount of light is incident on the light-receiving region. An example of the first optical portion 110 includes an object lens.

The SiPM 120 functions to convert photons of light which have arrived at the light receiving region of the SiPM 120 via the first optical portion 110 into photoelectrons which are then multiplied.

The SiPM 120 may include a plurality of microcells arrayed in matrix form or may consist exclusively of a single microcell.

The SiPM 120 manifests a multiplication factor of about $10^5 \sim 10^6$ and has a bias voltage of about 20 V. The structure of the SiPM 120 is specified later with reference to FIGS. 3 and 4.

The phosphor screen 130 functions to reconvert the photoelectrons multiplied by the SiPM 120 back into photons. The phosphor screen 130 includes a phosphor which emits light due to collision of the multiplied photoelectrons, and a black matrix having high light absorptivity, such as graphite, applied around the phosphor. The phosphor screen 130 may show a single color or a multicolor depending on the kind of phosphor.

The second optical portion 140 functions to transfer the photons converted by the phosphor screen 130 to the image sensor 150. An example of the second optical portion 140 includes an eye lens 140a (FIG. 1) or an optical fiber portion 140b (FIG. 2).

As such, the optical fiber portion 140b may be configured such that each optical fiber thereof is matched to correspond 1:1 to the phosphor screen 130 matched 1:1 with each microcell.

The image sensor 150 functions to pick-up the photons transferred via the second optical portion 140, thus obtaining an image. An example of the image sensor 150 includes a charge coupled device (CCD) or a complementary metal oxide semiconductor (CMOS).

Figure 3:
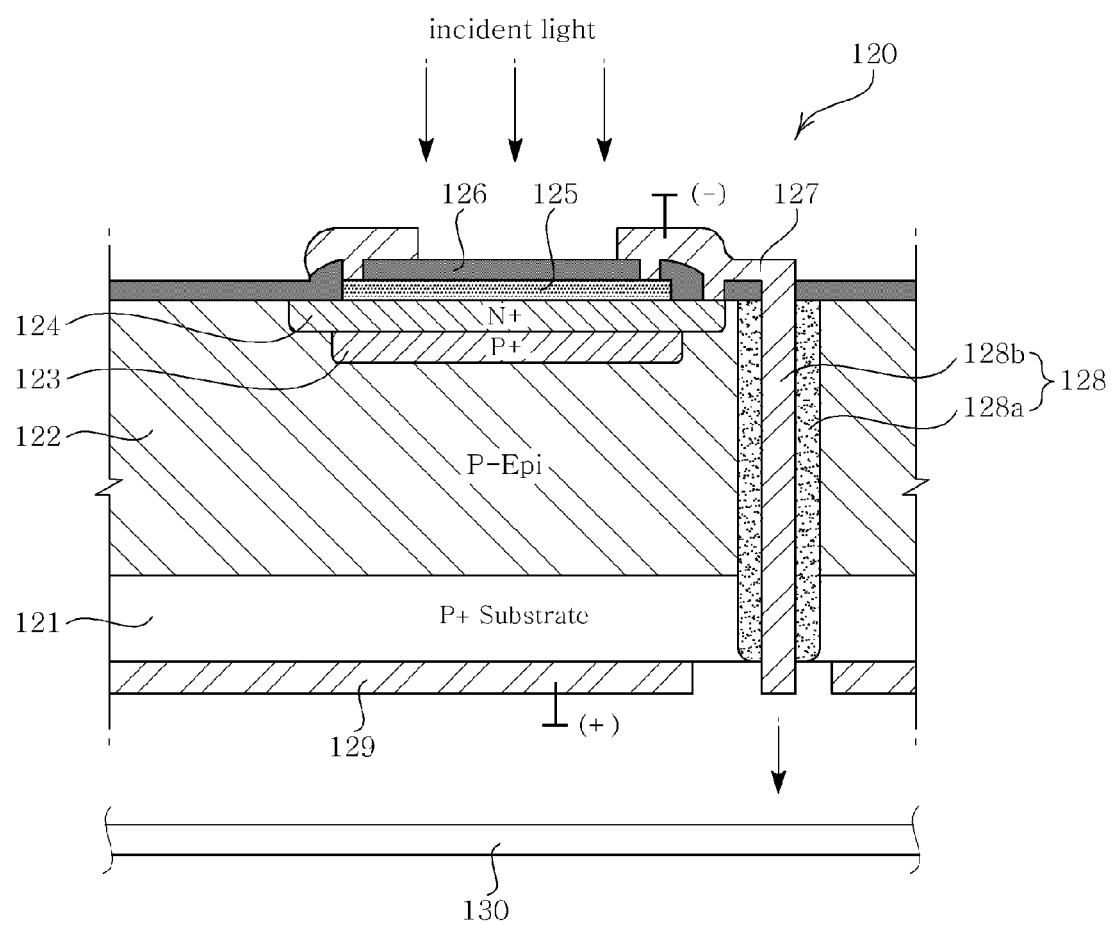
FIG. 3 is a cross-sectional view showing an example of a microcell of the silicon photomultiplier of FIG. 1.

FIG. 3 is a cross-sectional view showing an example of a microcell of the SiPM of FIG. 1.

As shown in FIG. 3, the microcell of the SiPM 120 according to the embodiment of the present invention includes a P-type silicon substrate 121, a P-type epitaxial layer 122, a high-concentration P-type conductive layer 123, a high-concentration N-type conductive layer 124, a polysilicon resistor 125, a silicon oxide layer 126, a voltage distribution bus 127, and a trench 128 for optically isolating microcells from each other and transferring the multiplied photoelectrons to the phosphor screen 130.

The P-type silicon substrate 121 has a doping agent concentration of $10^{17} \sim 10^{20}$ cm$^{-3}$, and the P-type epitaxial layer 122 which spatially changes is grown to a thickness of about 3 ~10 μm on the P-type silicon substrate 121. As such, the P-type epitaxial layer 122 has a doping agent concentration of $10^{14} \sim 10^{18}$ cm$^{-3}$.

The high-concentration P-type conductive layer 123 having a doping agent concentration of $10^{15} \sim 10^{18}$ cm$^{-3}$ is formed on the P-type epitaxial layer 122, and the high-concentration N-type conductive layer 124 having a doping agent concentration of $10^{18} \sim 10^{20}$ cm$^{-3}$ is formed on the high-concentration P-type conductive layer 123.

As such, PN junction occurs between the high-concentration P-type conductive layer 123 and the high-concentration N-type conductive layer 124, thus forming a depletion layer. The depth of the depletion layer is adjusted depending on the concentration of the conductive layers 123, 124, thereby controlling breakdown voltage. Specifically, as the concentration of the conductive layers 123, 124 to be doped is increased, the depth of the depletion layer is decreased and thus the breakdown voltage is also reduced.

When the breakdown voltage is reduced, a bias voltage, which is typically formed at a value equal to or higher than the breakdown voltage, may also be decreased.

Hence, when the concentration of the conductive layers 123, 124 is adjusted, in particular, when the concentration of the high-concentration P-type conductive layer 124 is adjusted, the bias voltage may be reduced (e.g. to 20 V or lower).

When the bias voltage is reduced in this way, the dark rate which is noise in the SiPM 120 may also be decreased.

Disposed on the high-concentration N-type conductive layer 124 is the polysilicon resistor 125 having a resistance of 1 kΩ~100 MΩ per microcell. The polysilicon resistor 125 is connected to the voltage distribution bus 127 in order to distribute the voltage to the high-concentration N-type conductive layer 124.

The silicon oxide layer 126, which is formed on the high-concentration N-type conductive layer 124 and the polysilicon resistor 125, is a kind of insulating layer, namely, an antireflection coating layer which reduces the reflection of incident light thus increasing sensitivity and which is able to increase light detection efficiency over a wide wavelength range because of the microcell sensitivity which was thus increased.

The silicon oxide layer 126 may be made of any one selected from among polysilicon, $Si_3N_4$, and indium tin oxide (ITO), or any one selected from among a combination of polysilicon and ITO and a combination of polysilicon and $Si_3N_4$, and has a thickness of about 20 ~100 nm.

The voltage distribution bus 127 is connected to the polysilicon resistor 125 and the high-concentration N-type conductive layer 124 so as to distribute the voltage to the high-concentration N-type conductive layer 124, and is made of a metal such as aluminum (Al).

The trench 128 is provided to optically isolate the microcells from each other and to transfer the multiplied photoelectrons to the phosphor screen 130 from the high-concentration N-type conductive layer 124.

The trench 128 includes an insulating portion 128a formed on the inner wall of the trench 128 and a first metal portion 128b integrated with the voltage distribution bus 127 by filling the center of the trench defined by the insulating portion 128a with a metal.

The insulating portion 128a is made of one or more insulating materials selected from among polyimide, polyester, polypropylene, polyethylene, ethylene vinyl acetate (EVA), acrylonitrile styrene acrylate (ASA), polymethyl methacrylate (PMMA), acrylonitrile butadiene styrene (ABS), polyamide, polyoxymethylene, polycarbonate, modified polyphenylene oxide (modified PPO), polybutylene terephthalate (PBT), polyethylene terephthalate (PET), polyester elastomer, polyphenylene sulfide (PPS), polysulfone, polyphthalic amide, polyether sulfone (PES), polyamide imide (PAI), polyether imide, polyether ketone, liquid crystal polymer, polyarylate, polytetrafluoroethylene (PEPE) and polysilicon, and the first metal portion 128b is made of Al.

Figure 4:
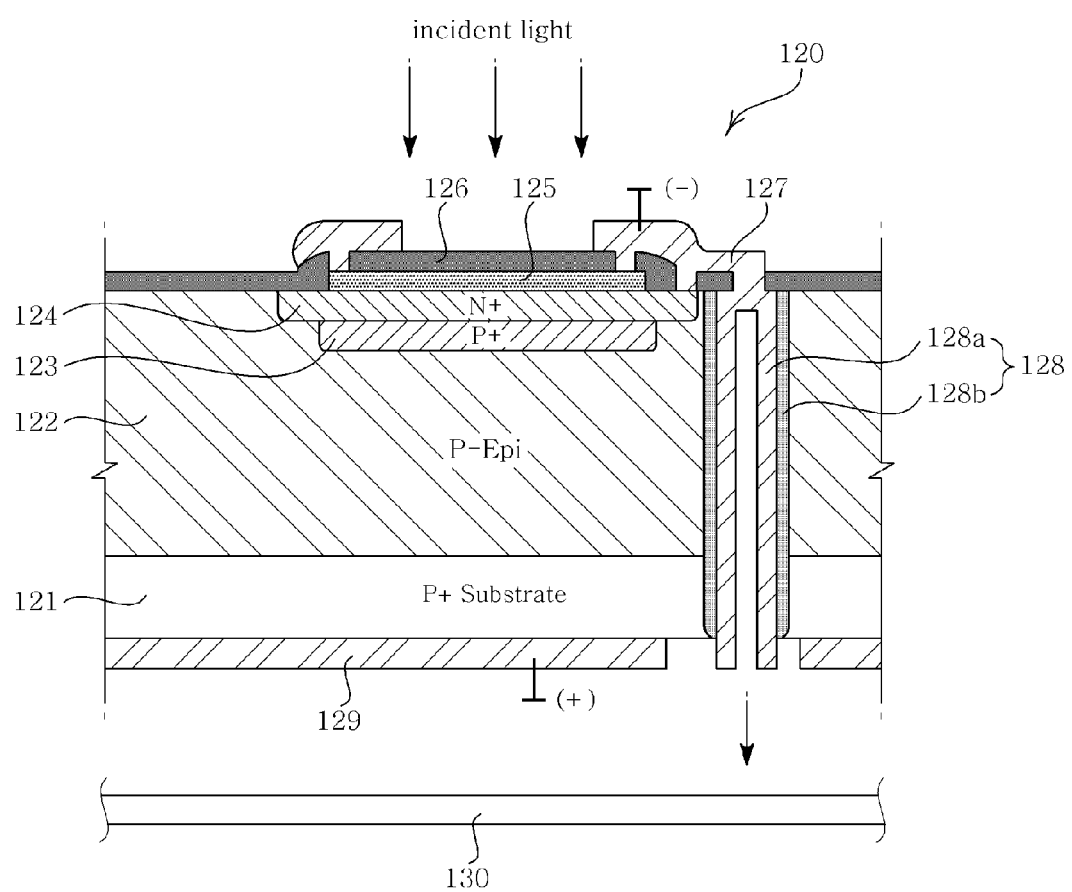
FIG. 4 is a cross-sectional view showing another example of a microcell of the silicon photomultiplier of FIG. 1.

FIG. 4 is a cross-sectional view showing another example of a microcell of the SiPM of FIG. 1. The microcell of FIG. 4 has the same configuration as that of FIG. 3 with the exception of the inner structure of the trench 128. Thus, the detailed description of the same constituents is omitted.

As shown in FIG. 4, a trench 128 for optically isolating the microcells from each other and for transferring the multiplied photoelectrons to the phosphor screen 130 includes an oxide film 128c formed on the inner wall of the trench 128 and a hollow-shaped second metal portion 128d integrated with the voltage distribution bus 127 by plating the inner surface of the oxide film 128c with a metal.

The oxide film 128c is composed of silicon oxide ($SiO_x$), and the second metal portion 128d is made of Al.

In the case of the trench 128 of FIG. 3, it is disadvantageous because the manufacturing process thereof is difficult and the manufacturing cost thereof is increased which is attributed to the insulating portion 128a made of an additional insulating material, but is advantageous in terms of a high degree of optical isolation because of a thick thickness (about 1~3 μm) of the insulating portion 128a.

Whereas, in the case of the trench 128 of FIG. 4, it has a degree of optical isolation lower than that of FIG. 3 but is advantageous because of the simple manufacturing process and reduced cost.

Thus, the trench of FIG. 3 or 4 may be selectively used so as to be adapted for the design purpose.

For the sake of the description, the single microcell able to detect a single photon is described in FIGS. 3 and 4, but the SiPM 120 including a plurality of microcells in array form may be used, so that light is incident on a large area thus enabling precise light detection, thereby obtaining a clear image having good image quality even at very low luminance. The array may be manufactured in the form of 2×2, 3×3, 4×4, 8×8 or 16×16.

Also, for the sake of the description, the SiPM including the P-type epitaxial layer, the high-concentration P-type conductive layer and the high-concentration N-type conductive which are sequentially formed on the P-type substrate is illustrated, but the opposite type SiPM is also possible and may exhibit the same effects as above.

In respective microcells of the SiPM 120, photons of incident light are converted into photoelectrons which are then multiplied, after which the multiplied photoelectrons are transferred to the phosphor screen 130 via the trench 128. As such, the phosphor screen 130 is matched to correspond 1:1 to each microcell.

The low-luminance imaging device 100, 200 using the SiPM according to the embodiment of the present invention is advantageous because a photomultiplication factor (about $10^5$~$10^6$) of the SiPM 120 is much higher than that of a conventional MCP-PMT, thus obtaining a clear image even at very low luminance.

Therefore, the low-luminance imaging device 100, 200 using the SiPM 120 according to the embodiment of the present invention may be applied to security and high-sensitivity cameras based on the light amplification method.

Furthermore, the bias voltage (about 20 V) for driving the SiPM 120 is much lower than that of the conventional MCP-PMT, thus obviating a need for a high voltage power supply, so that the configuration of the imaging device according to the present invention becomes simplified. Also, because the SiPM 120 is micro-sized, it is possible to reduce the size of the low-luminance imaging device using the SiPM 120.

As described hereinbefore, the present invention provides a low-luminance imaging device using a SiPM. According to the present invention, the low-luminance imaging device has a very high photomultiplication factor, so that a clear image can be obtained even at very low luminance.

Also, according to the present invention, a bias voltage for driving the SiPM is very low, thus obviating the need for a high voltage power supply, so that the imaging device according to the present invention has a simple configuration and a small size, and the manufactured cost thereof is reduced.

Although the embodiments of the present invention have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. An imaging device using a silicon photomultiplier, comprising:
    a first optical portion for collecting incident light;
    the silicon photomultiplier comprising a plurality of microcells so that photons of collected light are converted into photoelectrons which are then multiplied;
    a phosphor screen for converting the multiplied photoelectrons into photons;
    a second optical portion for transferring the converted photons; and
    an image sensor for picking-up the transferred photons thus obtaining an image.

2. The imaging device as set forth in claim 1, wherein the first optical portion is an object lens.

3. The imaging device as set forth in claim 1, wherein the silicon photomultiplier comprises:
    a first type silicon substrate;
    a first type epitaxial layer formed on the first type substrate;
    a high-concentration first type conductive layer formed on the first type epitaxial layer;
    a high-concentration second type conductive layer doped with a second type opposite the first type and formed on the high-concentration first type conductive layer;
    a polysilicon resistor formed on the high-concentration second type conductive layer so as to distribute voltage to the high-concentration second type conductive layer;
    an antireflection coating layer formed on the high-concentration second type conductive layer and the polysilicon resistor;
    a voltage distribution bus connected to the polysilicon resistor and the high-concentration second type conductive layer so as to distribute voltage to the high-concentration second type conductive layer; and
    a trench for optically isolating the microcells from each other and transferring the multiplied photoelectrons to the phosphor screen from the high-concentration second type conductive layer.

4. The imaging device as set forth in claim 3, wherein the first type silicon substrate has a doping agent concentration of $10^{17}$~$10^{20}$ cm$^{-3}$.

5. The imaging device as set forth in claim 3, wherein the first type epitaxial layer has a doping agent concentration of $10^{14}$~$10^{18}$ cm$^{-3}$ and a thickness of 3 ~10 μm.

6. The imaging device as set forth in claim 3, wherein the high-concentration first type conductive layer has a doping agent concentration of $10^{15}$~$10^{18}$ cm$^{-3}$, and the high-concentration second type conductive layer has a doping agent concentration of $10^{18}$~$10^{20}$ cm$^{-3}$.

7. The imaging device as set forth in claim 3, wherein the trench comprises an insulating portion formed on an inner wall of the trench and a first metal portion integrated with the voltage distribution bus by filling a center of the trench defined by the insulating portion with a metal.

8. The imaging device as set forth in claim 3, wherein the trench comprises an oxide film formed on an inner wall of the trench and a hollow-shaped second metal portion integrated with the voltage distribution bus by plating an inner surface of the oxide film with a metal.

9. The imaging device as set forth in claim 1, wherein the second optical portion is an eye lens.

10. The imaging device as set forth in claim 1, wherein the second optical portion is an optical fiber portion.

11. The imaging device as set forth in claim 1, wherein the image sensor is a charge coupled device or a complementary metal oxide semiconductor.

\* \* \* \* \*